(12) United States Patent
Van Zyl (10) Patent No.: US 11,374,565 B2
(45) Date of Patent: Jun. 28, 2022

(54) SYSTEM AND APPARATUS WITH LOW POWER PIN DIODE DRIVERS

(71) Applicant: Advanced Energy Industries, Inc., Fort Collins, CO (US)

(72) Inventor: Gideon Van Zyl, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 17/155,928

(22) Filed: Jan. 22, 2021

(65) Prior Publication Data

US 2021/0143816 A1 May 13, 2021

Related U.S. Application Data

(63) Continuation of application No. 16/245,926, filed on Jan. 11, 2019, now Pat. No. 10,903,837.

(60) Provisional application No. 62/616,303, filed on Jan. 11, 2018.

(51) Int. Cl.
| | |
|---|---|
| *H03H 11/28* | (2006.01) |
| *H01L 29/868* | (2006.01) |
| *H03K 17/74* | (2006.01) |
| *H04W 52/00* | (2009.01) |

(52) U.S. Cl.
CPC ............. *H03K 17/74* (2013.01); *H03H 11/28* (2013.01); *H04W 52/00* (2013.01); *H01L 29/868* (2013.01)

(58) Field of Classification Search
CPC ....... H03K 17/74; H03H 11/28; H04W 52/00; H01L 29/868
See application file for complete search history.

(56) References Cited

U.S. PATENT DOCUMENTS

| | | | |
|---|---|---|---|
| 4,196,381 A | 4/1980 | Standing | |
| 4,253,035 A * | 2/1981 | Amitay | H03K 17/667 326/129 |
| 4,486,722 A | 12/1984 | Landt | |
| 4,743,096 A | 5/1988 | Wakai et al. | |
| 6,937,846 B1 | 8/2005 | Herzberg | |
| 7,174,142 B2 | 2/2007 | Watabe | |

(Continued)

FOREIGN PATENT DOCUMENTS

| | | |
|---|---|---|
| CN | 103630857 A | 3/2014 |
| EP | 2953263 A1 | 12/2015 |

OTHER PUBLICATIONS

EPO, "Communication Pursuant to Rules 161(1) and 162 EPC Regarding Application No. 19702765.9", dated Aug. 18, 2020, p. 3, Published in: EP.

(Continued)

*Primary Examiner* — Dinh T Le
(74) *Attorney, Agent, or Firm* — Neugeboren O'Dowd PC (57) ABSTRACT

This disclosure relates to apparatus and methods for radio-frequency (RF) switching circuits, and more particularly for a PIN diode driver circuit for high speed, high repetition rate and/or high power applications. The PIN diode driver may include a dual voltage reverse bias provided to the PIN diode, which dual voltage reverse bias may be provided by a first, relatively lower voltage, power supply and a second, relatively higher voltage, power supply. The relatively lower voltage is to discharge an intrinsic layer of the PIN diode at a lower voltage than during reverse bias of the PIN diode at the second relatively higher bias voltage in order to reduce overall power consumption.

13 Claims, 8 Drawing Sheets

(56) References Cited

U.S. PATENT DOCUMENTS

| | | | | |
|---|---|---|---|---|
| 7,193,589 | B2* | 3/2007 | Yoshida | G09G 3/3241 |
| | | | | 345/76 |
| 9,500,727 | B2* | 11/2016 | Sohn | G01R 33/54 |
| 9,531,340 | B2* | 12/2016 | Saitou | H03H 7/40 |
| 9,882,529 | B2 | 1/2018 | Larsen | |
| 2002/0153531 | A1 | 10/2002 | Levine et al. | |
| 2005/0212408 | A1 | 9/2005 | Yoshida et al. | |
| 2005/0255818 | A1 | 11/2005 | Watabe | |
| 2009/0079880 | A1 | 3/2009 | Ohira | |
| 2009/0174483 | A1 | 7/2009 | Hesen et al. | |
| 2015/0349713 | A1 | 12/2015 | Larsen | |
| 2018/0234086 | A1 | 8/2018 | Fields et al. | |
| 2019/0180986 | A1 | 6/2019 | Torii | |

OTHER PUBLICATIONS

Beasley-Suffolk, D, "International Preliminary Report on Patentability Regarding International Application No. PCT/US2019/013254", dated Jul. 23, 2020, p. 8, Published in: EP.

TIPO, "Office Action Regarding Taiwanese Patent Application No. 108101196", dated Jul. 15, 2020, p. 11, Published in: TW.

Le, Dinh Thanh, "Office Action Regarding U.S. Appl. No. 16/245,926", dated Jun. 19, 2020, p. 19, Published in: US.

Abily, Yolande, "International Search Report and Written Opinion Regarding International Application No. PCT/US2019/013254", dated Mar. 18, 2019, p. 11, Published in: EP.

Poos, John, "Office Action Issued in U.S. Appl. No. 16/293,414", dated Oct. 25, 2019, p. 6, Published in: US.

International Searching Authority, "International Search Report and Written Opinion Issued in International Application No. PCT/US2019/0020800", dated May 14, 2019, p. 10, Published in: PCT.

CNIPA, "Notification of the First Office Action Regarding Application No. 201980013985.2", dated May 7, 2021, p. 15, Published in: CN.

Beasley-Suffolk, Damian "Communication Pursuant To Art 94(3) Re Application No. 19 702 765.9", Mar. 10, 2022, p. 4, Published in: EPO.

TIPO, "Office Action Re Taiwan Application No. 110105915", dated Mar. 25, 2022, p. 6, Published in: TW.

* cited by examiner

SYSTEM AND APPARATUS WITH LOW POWER PIN DIODE DRIVERS

PRIORITY

This patent application is a continuation of U.S. patent application Ser. No. 16/245,926 filed Jan. 11, 2019 entitled Low Power PIN Diode Driver, which claims priority to U.S. Patent Application No. 62/616,303, filed Jan. 11, 2018 entitled "Triple Supply Pin Diode Driver," the entire contents of which is incorporated herein by reference for all purposes.

TECHNICAL FIELD

Embodiments of the present disclosure generally relate to diode driver circuits, and more particularly to a PIN diode driver that employees a lower reverse bias voltage followed by a higher reverse bias voltage to reduce power consumption from the PIN diode for example during high speed switching applications.

BACKGROUND

PIN diodes are used in many different applications. In one particular example, PIN diodes may be used in matching networks to match the impedance of a load to an impedance into which a high power radio frequency generator can deliver power. Regardless of the specific use, high speed switching of PIN diodes may involve high power consumption each switch cycle, which is exacerbated in devices using multiple PIN diodes. It is with these observations in mind, among others, that aspects of the present disclosure were conceived.

SUMMARY

Aspects of the present disclosure generally relate to apparatus, systems and methods for radio-frequency (RF) switching circuits, and more particularly for a PIN diode driver circuits for high speed, high repetition rate and/or high power applications. In one example, the driver circuit includes a dual voltage reverse bias provided to the PIN diode, which dual voltage reverse bias may be provided by a first, relatively lower voltage, power supply and a second, relatively higher voltage, power supply. Forward bias current may be provided by a third power supply, in some examples.

Embodiments further involve a method of driving a PIN diode that, when in a reverse biasing of a PIN diode, involves connecting a first reverse bias voltage to the PIN diode. after connecting the first reverse bias voltage to the PIN diode and before forward biasing the PIN diode, the method further involves connecting a second reverse bias voltage, greater than the first reverse bias voltage, to the PIN diode. The first reverse bias voltage is to discharge an intrinsic layer of the PIN diode at a lower voltage than during reverse bias of the PIN diode at the second reverse bias voltage in order to reduce overall power consumption, as compared, for example, to a conventional PIN diode that deploys only one large reverse bias voltage.

Another embodiment involves a power system comprising a PIN diode driver circuit, the power supply providing a first reverse bias voltage to the PIN diode and a second reverse bias voltage, greater than the first reverse bias voltage, successively to the PIN diode during a reverse bias of the PIN diode. In one example, the power supply includes a first voltage power supply and a second voltage power supply. The power supply further includes a first switching device connecting a forward bias current supply to the PIN diode when the first switching device is configured in a closed state, the forward bias current providing a forward biasing current to the PIN diode to forward bias the PIN diode, and at least one second switching device switchable configurable between a first position and a second position, the first position connecting the first low voltage supply to the PIN diode to reverse bias the PIN diode and the second position connecting the second voltage supply to the PIN diode to reverse bias the PIN diode.

Another embodiment involves a variable impedance matching network comprising a variable reactance element comprising a PIN diode coupled with a capacitor, a first switch configured to connect a forward bias supply to the PIN diode to forward bias the PIN diode, and a second switch configured to connect at least one reverse bias supply to the PIN diode at a first reverse bias level followed by a second reverse bias level. In one example, the first reverse bias level is a first reverse bias voltage and the second reverse bias level is a second reverse bias voltage greater than the first reverse bias voltage.

These and other aspects and embodiments of the present disclosure are discussed and described further below.

DETAILED DESCRIPTION

A PIN diode is an electrical diode device with an un-doped or lightly doped intrinsic (I) semiconductor region sandwiched between a heavily doped p-type semiconductor region (P) and a heavily doped n-type semiconductor region (N); hence, the "PIN diode" designation. In general, PIN diodes obey conventional diode behavior at low frequency input signals, but operate as a resistor in the forward biased or on-state and as a small capacitor in the reverse biased or off-state at higher frequency input signals. As such, PIN diodes are often utilized in attenuators, fast switches, radio frequency (RF) applications, and high voltage electronic applications where high isolation and low loss are desired. In one particular implementation, PIN diodes are used in an impedance match network configured to match a changing load impedance of a plasma load to a desired impedance (e.g., 50 ohm or 70 ohm) so that a high power RF generator can efficiently deliver power. In such an implementation, the PIN diodes serve to connect or disconnect reactive components, typically capacitors, of the impedance matching network to quickly alter the properties of the matching network by switching the reactive elements in and out of the network.

Figure 1A:
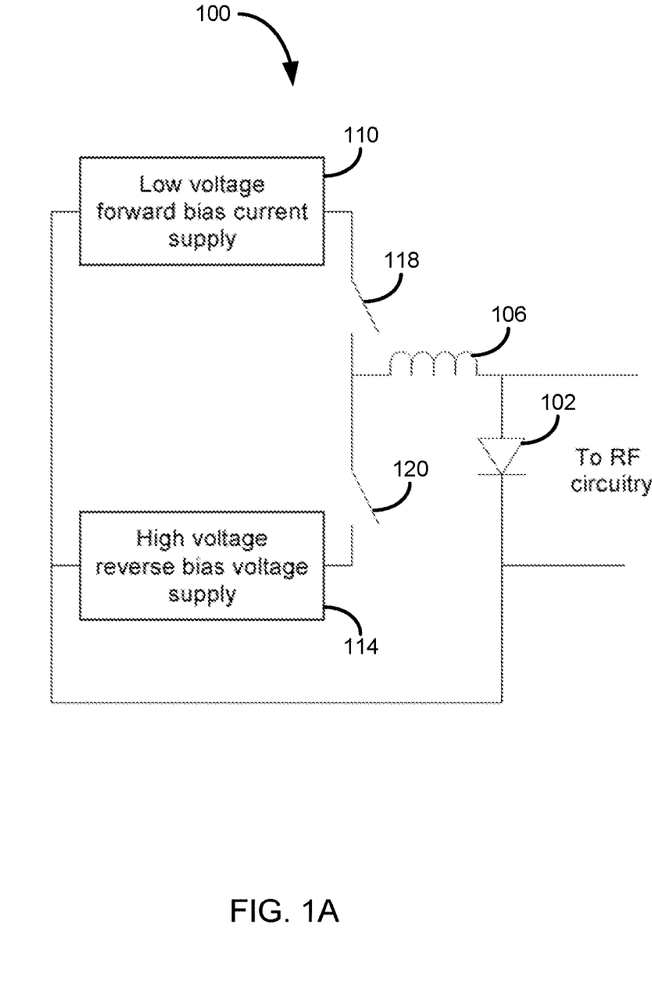
FIGS. 1A-1B illustrate two conventional dual supply PIN diode driver circuits.
Figure 1B:
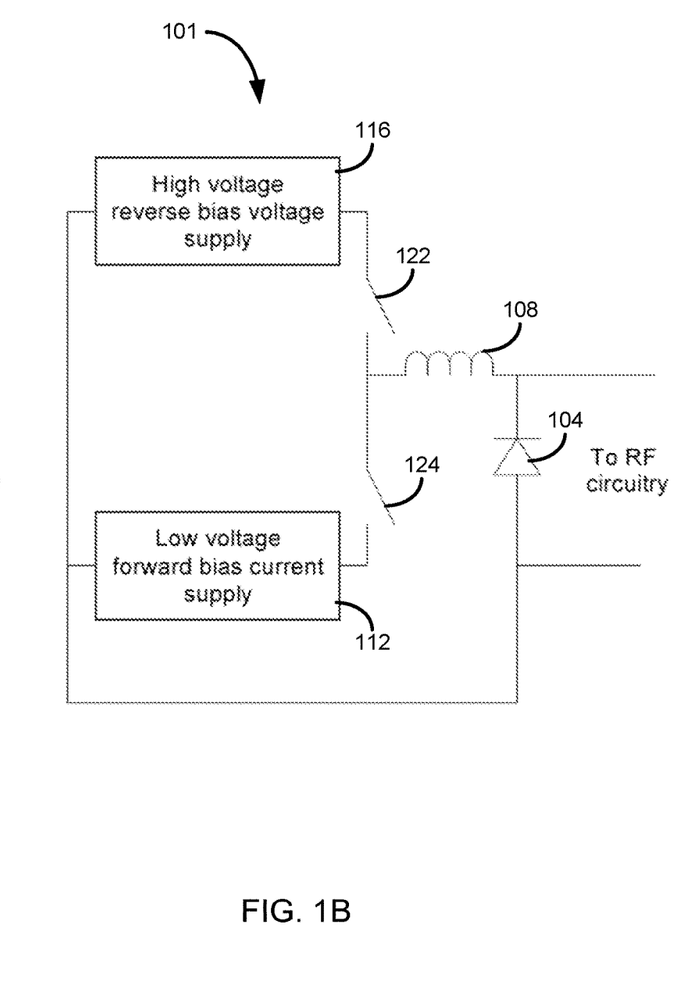

PIN diodes in a switching circuit typically have an accompanying PIN diode driver circuit or switch driver that provides a controlled forward bias current and a reverse bias voltage. For example, FIGS. 1A and 1B illustrate two conventional dual supply PIN diode driver circuits, 100, 101. Each circuit includes a respective PIN-type diode 102, 104, which may in turn be connected to some type of RF circuitry, for example. Each PIN diode 102, 104 is driven by two power supplies (supplies 110 and 114 for circuit 100, and supplies 112 and 116 for circuit 101) to provide a forward bias current and a reverse bias voltage to the respective PIN diodes. For example, in the circuit 100, the low voltage forward bias current supply 110 is serially connected to a switch 118 and the high voltage reverse bias voltage supply 114 is also connected to a switch 120. When the switch 118 is closed (and switch 120 is open), the forward bias current supply 110 provides a forward bias current to the PIN diode 102. When switch 120 is closed (and switch 118 is opened), the reverse bias voltage supply 114 provides a reverse bias voltage across the PIN diode 102. Similarly, in circuit 101, a high voltage reverse bias voltage supply 116 is serially connected to a switch 122 to provide a reverse bias voltage across the PIN diode 104 when switch 122 is closed and a low voltage forward bias current supply 112 provides a forward bias current to the PIN diode 104 when switch 124 is closed. The inductors 106, 108 in the circuits 100, 101 may be inductors, but are also meant more generally to symbolize any circuits that pass direct-current (DC) at low frequencies, but suppresses the RF frequency applied to the PIN diodes 102, 104 by the RF circuitry. Examples of the type of circuits that may be at position 106, 108 include an RF choke, a parallel resonant LC tank or tanks, a quarter wavelength (at RF frequency) transmission line, etc.

Figure 2A:
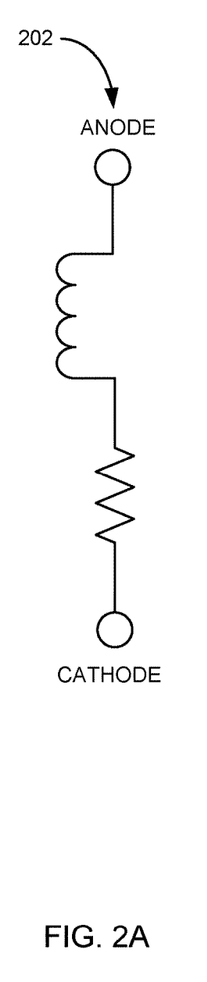
FIGS. 2A-2B illustrate PIN diode equivalent circuits.

Referring to circuit 100 as an example, the operation of the PIN diode driver circuit is now described. To forward bias the PIN diode 102, switch 118 is closed and switch 120 is open. The low voltage current supply 110 provides a forward bias current to the PIN diode 102. When the PIN diode is forward biased, holes from the P region material and electrons from the N region material of the diode 102 are injected into the sandwiched I region material. As the charges in the diode 102 cannot recombine instantaneously, a net charge is stored in the I region for an amount of time, known as the carrier lifetime. The diode thus acts as a resistor with an effective "on" resistance value at RF frequency. An equivalent forward biased circuit 202 is illustrated in FIG. 2A.

Figure 2B:
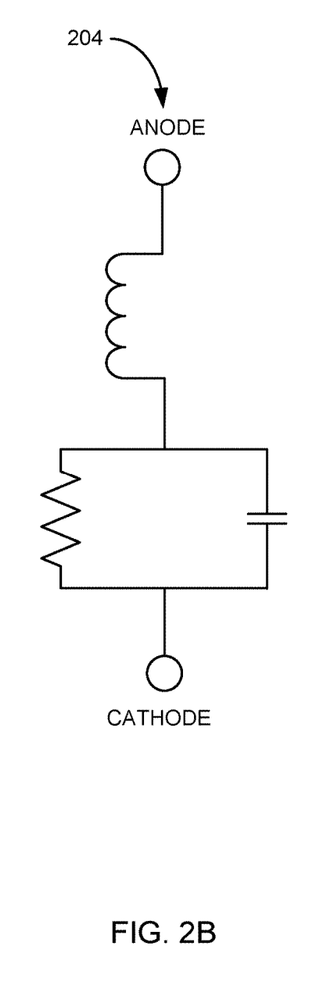

To reverse-bias the PIN diode 102, switch 118 is opened and switch 120 is closed to provide a reverse bias voltage to the PIN diode from the high voltage reverse bias voltage supply 114. During reverse-bias operation, the PIN diode 102 has an equivalent circuit (204 of FIG. 2B) of a large resistor shunted by a small capacitance. By varying aspects of the PIN diode 102, a variety of forward-bias resistance and reverse-bias capacitance may be achieved for specific application in various contexts.

The potential performance issue with conventional PIN diode driver circuits 100, 101 is that such PIN diode drivers may consume large amounts of power when used in high speed, high repetition rate and/or high power applications.

For purposes of illustration, when a PIN diode 102 is used in a high power application with frequencies ranging from 3 to 30 MHz, the PIN diode 102 may be forward biased with 1 amp from the forward bias current supply 110 and reverse biased with 1500 V from the reverse bias voltage supply 114. The carrier lifetime for a typical diode in such an application may be about 12 μs. To quickly (e.g. in a time period shorter than the carrier lifetime) switch from the forward biased (on) state to the reverse biased (off) state, the charge that must be removed from the diode tends to be the product of the forward current and carrier lifetime. In the example referenced immediately above, a charge of 12 μC is to be removed to switch from the forward biased to reverse biased state. If this charge is removed by the high voltage power supply 114, the energy expended is the product of the power supply voltage and the charge, i.e., 1500 V×12 μC=18 mJ. If this operation is performed at a high repetition rate, the power required can be prohibitive for many types of applications. For example, if the operation of the PIN diode 102 is to be performed at a 10 kHz repetition rate, the power from the high voltage power supply 114 in this example is 18 mJ×10 kHz=180 W.

Figure 3A:
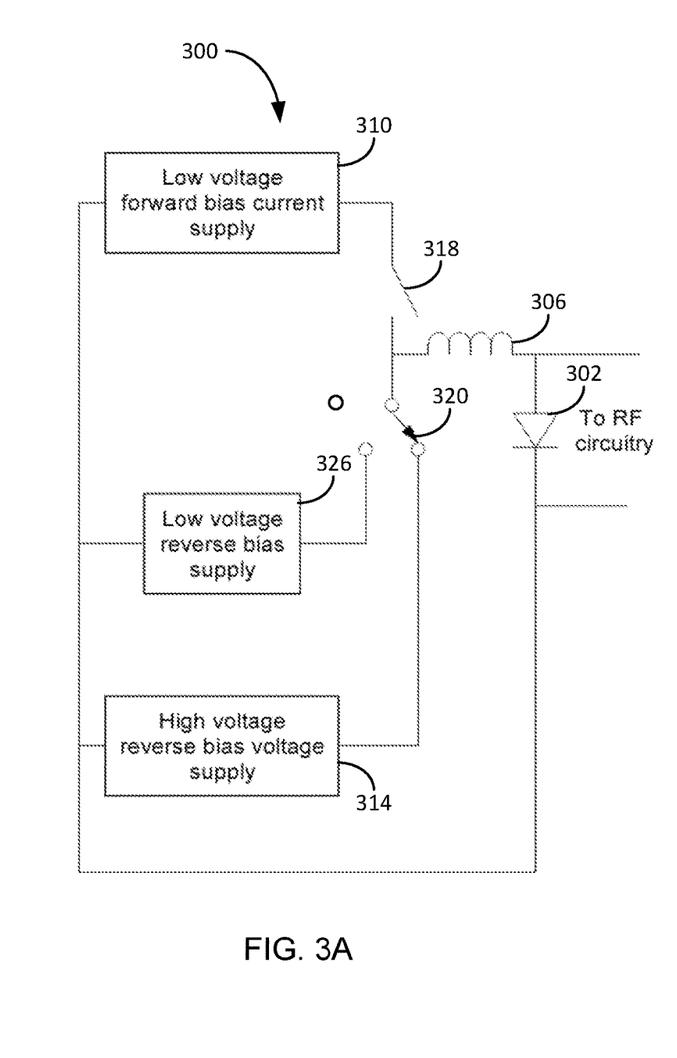
FIGS. 3A-3B illustrate two example triple-supply PIN diode driver circuits.
Figure 3B:
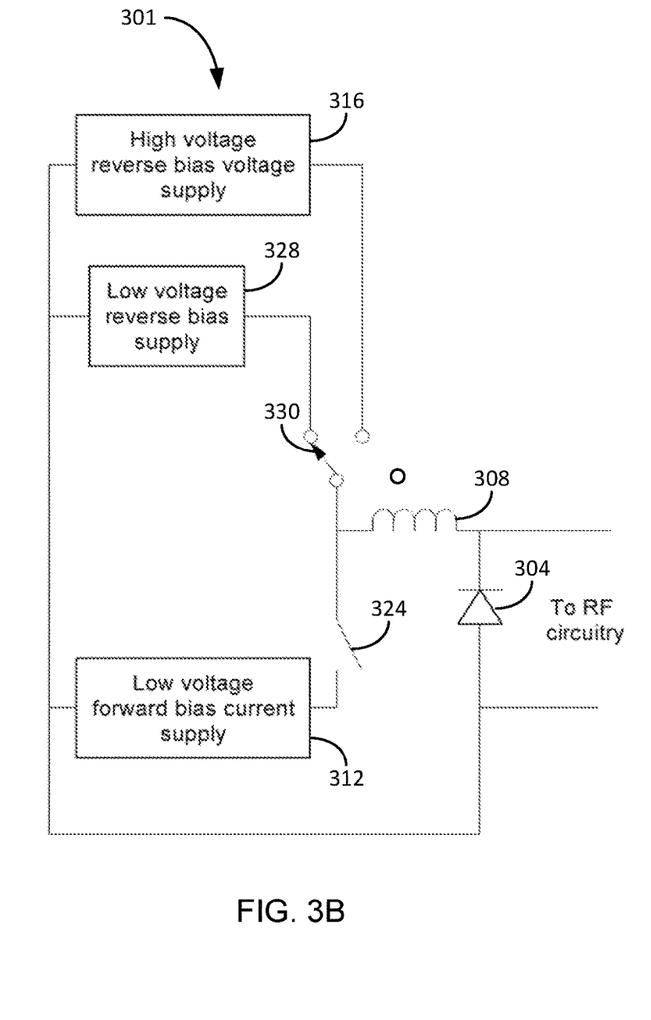

One solution to reducing the power consumed in such high speed, high repetition rate, and/or high power RF applications as it relates to the operation of the PIN diode 102 is to use at least one additional power supply to recover the diode from the "on" state to the "off" state at a lower voltage than the reverse bias voltage before applying the high voltage reverse bias. FIGS. 3A-3B illustrate two example triple supply PIN diode driver circuits 300, 301 corresponding to the diode configuration driver circuits 100, 101 of FIGS. 1A-1B. However, the driver circuits 300, 301 of FIGS. 3A-3B include additional respective power supplies 326, 328 that each provide a low voltage reverse bias to the respective PIN diodes 302, 304. By applying a low reverse bias voltage to the PIN diodes 302 or 304, the diode recovers (the intrinsic layer charge is removed) from the on state to the off state (or forward-bias to reverse-bias) at a lower voltage than conventional PIN diode drivers, thereby consuming less power, among other advantages.

In particular, referring to FIG. 3A, the driver circuit 300 includes a PIN diode 302, which may be connected to or otherwise integrated in various possible types of RF circuitry or other circuitry. In the RF circuitry applications discussed herein, the circuit may further include a representative inductance 306 or other form of circuit that passes DC and low frequencies but suppresses the RF frequency applied to the PIN diodes by the RF circuitry. The driver circuit further includes a low voltage forward bias current supply 310 connected to switch 318 to provide a forward bias current to the PIN diode with switch 318 is closed.

The circuit further includes a high voltage reverse bias voltage supply 314 connected to switch 320 to provide a reverse bias voltage to the PIN diode.

Unlike the driver circuits illustrated in FIGS. 1A and 1B, the driver circuits 300, 301, include an additional power voltage supply 326, 328 to provide a low voltage reverse bias voltage to the respective PIN diodes 302, 304. Referring to FIG. 3A, the forward bias current supply 310 is provided to PIN diode 302 to forward bias the device as discussed above. However, to reverse bias the PIN diode 302, a combination of the low voltage reverse bias supply 326 and the high voltage reverse bias supply 314 is used. More particularly, in one specific example, a switch 320 may be used to select between the low voltage reverse bias supply 326 and the high voltage reverse bias supply 314 when reverse biasing the PIN diode 302. The switch may also switch out both reverse bias supplies when the forward bias current supply is connected. In a first configuration, when the forward bias current is switched out, the switch 320 first connects the low voltage reverse bias supply 326 to the PIN diode 302. In reverse bias operation, the first configuration provides low voltage intrinsic layer charge removal. At some time later, the switch 320 may be oriented in a second configuration that connects the high voltage reverse bias supply 314 to the PIN diode 302 to provide a high voltage reverse bias signal.

The time that the PIN diode is connected to the low voltage reverse bias supply before connecting to the high voltage reverse bias supply is generally chosen so that most, if not all, of the charge stored in the intrinsic region of the PIN diode is removed before connecting to the high voltage power supply. This time depends on the level of reverse current used to remove the charge. For high current levels and fast switching the total charge to be removed is approximately equal to the forward current just prior to initiating reverse biasing the PIN diode times the carrier lifetime. To illustrate with a numerical example and referring to FIG. 3A, assume that the first (e.g., low) voltage reverse bias voltage is 15 V, the representative inductor 306 is an inductor with a value of 2 µH, the forward bias current is 1 A and the carrier lifetime is 12 µs. With these values the time to remove the charge is approximately 1.8 µs during which time the reverse current will increase to approximately 13.5 A ignoring detailed characteristics of the PIN diode charge distribution. A detailed analysis of drivers of this type shows that it is rarely possible to remove all the charge using the low voltage power supply. In most cases charge will be completely removed at the P-I or I-N interface blocking further effective removal of charge remaining in the I region. Despite this behavior significant power can be saved using this approach. In the illustrated example, the first reverse voltage supply is disconnected when the second (e.g., higher at 1500 volts), reverse voltage supply is connected to the PIN diode. Disconnection of the low voltage reverse bias supply when the high voltage reverse bias supply is connected can be done with a diode as shown infra. In the example of FIG. 3B, the first reverse bias voltage may be about −15 volts and the second reverse bias voltage may be about −1500 volts, with a similar power saving effect. In the example of FIG. 3B, the second voltage may be referred to as a "higher" or "greater" voltage herein for simplicity sake as it is a greater negative voltage (e.g., −1500 volts) than the first voltage (e.g., −15 volts).

In some RF circuit implementations, such as impedance matching networks discussed herein, PIN diodes may be switched from the forward biased (on) state to the reverse biased (off) state at a high repetition rate. For example, some such circuits may switch the PIN diode at a rate faster than the carrier lifetime of 12 µs to connect and disconnect the capacitors for the impedance matching, often repeating at a rate of 10 kHz. Thus, switches 318, 320 of the PIN diode driver circuit 300 of FIG. 3A may be controlled to quickly switch between the forward bias supply and the reverse bias supplies. More particularly, opening of switch 318 and configuring switch 320 between a first position (to connect the low voltage reverse bias supply 326) and a second position (to connect the high voltage reverse bias supply 314) may occur at a rate of 10 kHz to provide the adequate impedance matching performance for such networks. It should be appreciated that the rate at which switches 318, 320 are activated and controlled may be dependent upon the type of RF circuit to which the PIN diode driver is connected. Differing RF circuits may utilize different rates of PIN diode switching. In many cases, however, the use of a third low voltage bias supply to aid in the switching operation of the PIN diode may reduce the consumed power of the circuit.

In the example illustrated, two reverse bias power supplies are illustrated, with one providing a relatively lower voltage primarily for charge removal, and the other providing a relatively higher voltage primarily for reverse bias operation of the pin diode. A multi-position switch is further illustrated to switch between the supplies, and disconnect both supplies. Alternatively, a power supply with two or more voltage settings may be employed in conjunction with a single position switch, such as shown in FIG. 1A. In such an arrangement, during reverse bias operation, the forward bias current power supply is switched out, and the multi-level power supply is connected to the pin diode. The multi-level power supply may then be internally switched first to a relatively low reverse bias voltage mode and subsequently to a relatively high voltage reverse bias mode.

Regardless of whether two reverse bias power supplies are used or a multi-level reverse power supply is used, the power required to switch the PIN diode 302 between forward bias and reverse bias, and discharge the intrinsic layer, is decreased relative to conventional driver circuits such as illustrated in FIGS. 1A and 1B. For example, assume that the low voltage reverse bias supply 326 of driver circuit 300 is a 15 V power supply. Utilizing this supply 326 to recover the PIN 302 diode in the example above, the power consumed to recover the diode is reduced by a factor 100 compared to using a 1500 V supply to recover the diode (such as high voltage reverse bias voltage supply 314). This reduction in power consumed through the use of the low voltage reverse bias supply 326 is especially felt in high speed, high repetition rate and/or high power applications that utilize the PIN diode 302. The factor 100 (the ratio between the two voltages) is the theoretical maximum reduction in consumed power assuming that all stored charge is removed by a supply with a 100 times lower voltage.

Such a large reduction in consumed power may not be realized in some applications due to the characteristics of PIN diodes. Nevertheless, significant power saving can be achieved using the concepts discussed herein and reflected in the various example circuits. For effective power saving, ratios of between 3 and 2000 between the voltage of the low voltage reverse bias supply and the voltage of the high voltage reverse bias supply are contemplated. Simulations using realistic PIN diode models, predict power saving factors of between 1.8 and 4.1 using a circuit similar to the circuit of FIG. 3A in which an inductor 306 is 60 µH. For switching a typical high power PIN diode from the ON to the OFF state in 5 microseconds, a power saving factor of 1.8 is predicted using a low voltage supply of about 180 V and a high voltage supply of about 1500 V. Switching the same diode in 20 microseconds, a power saving factor of 3.3 is predicted using 20 V for the low voltage supply with a high voltage supply of about 1500 V, and switching the same diode in 50 microseconds a power saving factor of 4.1 is predicted using a low voltage supply of 1 V and a high voltage supply of 1500 V. Since the optimum value of the low voltage reverse bias supply depends on the desired switching speed, in some applications one or both of the voltage bias supplies (e.g., the low voltage bias supply) may be variable and adjusted for optimum performance depending on the desired switching speed.

Driver circuit 301 operates in a similar manner where switch 330 has a first configuration to provide a low reverse bias voltage 328 at a first time and a high reverse bias voltage 316 at a second time to reduce the power consumption by the circuit to drive the PIN diode 304 from a forward bias condition to a reverse bias condition.

Figure 4A:
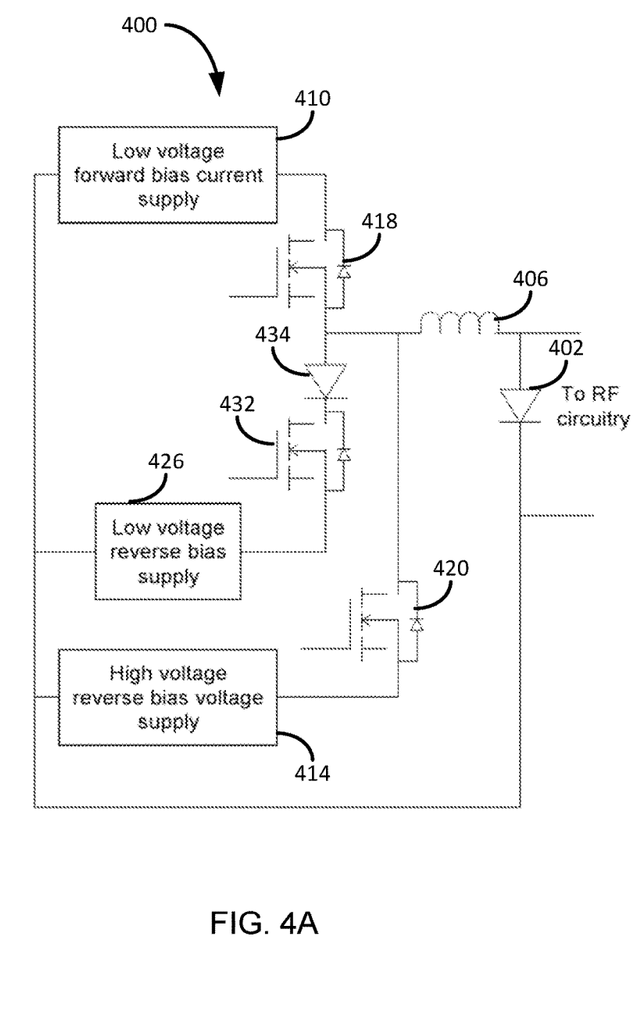
FIGS. 4A-4B illustrate two example implementations of a triple supply PIN diode driver circuit.
Figure 4B:
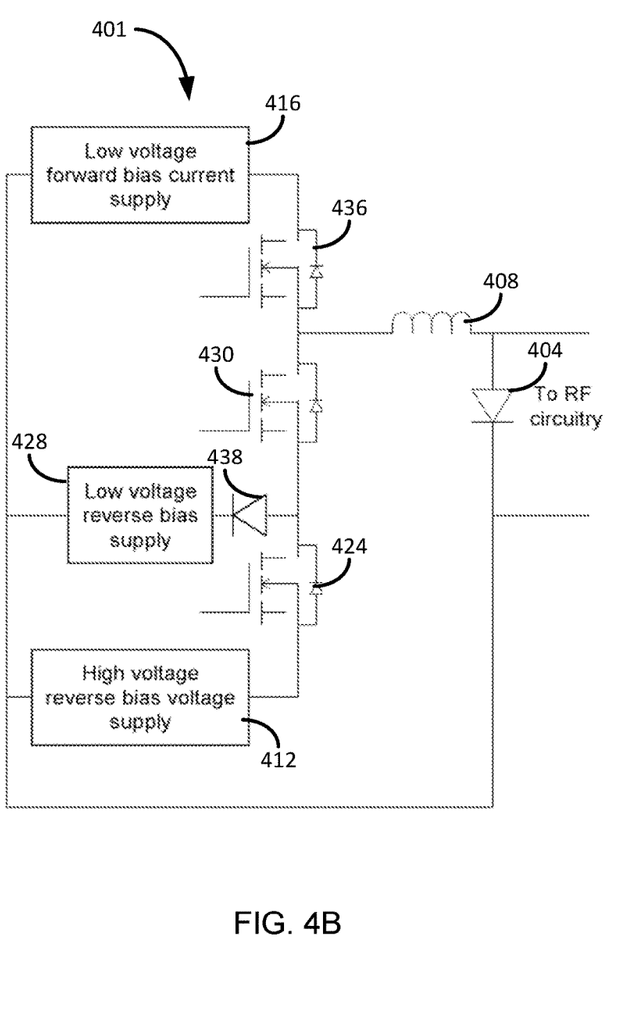

FIGS. 4A-4B illustrates two possible implementations of a triple supply PIN diode driver circuit. The term "triple" referring to three distinct bias values applied to the PIN diode including a forward bias and a first reverse bias and a second reverse bias. In examples, the three distinct bias values may be a forward bias current and associated supply, a first low reverse bias voltage and associated supply and a second reverse bias voltage and associated supply or a first low reverse bias voltage and a second reverse bias voltage from an associated multilevel supply.

FIG. 4A illustrates one specific implementation of a triple supply diode driver circuit. Similar to the circuits described above, the circuit 400 may include a PIN diode 402, which may be connected to some form of RF circuitry, a representative inductance 406, a low voltage forward bias current supply 410 connected to switch 418 to provide a forward bias current to the PIN diode, and a high voltage reverse bias voltage supply 414 connected to switch 420 to provide a reverse bias voltage to the PIN diode. In the circuit 400, switch 418 and switch 420 are field effect transistors (FET), and in particular a metal oxide semiconductor field effect transistor (MOSFET). It should be appreciated, however, that others types of electronic switching devices may be utilized in the circuit 400 for switching between an open state and a closed state.

As shown in the circuit 400, a high voltage reverse bias voltage supply 414 connects to the PIN diode 402 through a first switch 420. Switch 420 may be a MOSFET-type switching device that operates in a similar manner as described above to provide high voltage reverse bias voltage to the PIN diode to drive the PIN diode into a reverse bias state. In addition, a low voltage reverse bias supply 426 may be included in the circuit 400 to provide a low voltage reverse bias signal to the PIN diode 402 through operation of switch 432. As otherwise discussed, the first reverse bias voltage serves to discharge or otherwise remove the charge build-up in the intrinsic region at a relatively lower voltage, as compared to the high voltage supply 414, thereby reducing the power consumed by the circuit. In particular, through the operation of switch 420 and switch 432, the driver circuit 400 may first supply a low voltage reverse bias signal to the PIN diode when switching to an "off" state from low voltage reverse bias supply 426 followed by a high voltage reverse bias signal from the high voltage reverse bias supply 414. That is, the first, relatively lower reverse bias voltage, is connected prior to connecting the second, relatively larger reverse bias voltage. Switch 432 may be connected in series between the low voltage reverse bias supply 446 and a diode 434 to provide, when the third switch 432 is in a closed state and switches 418 and 420 are in an open state, a low voltage reverse bias signal to the PIN diode 402. Because MOSFETs have body diodes, the diode 434 (and similarly 438, FIG. 4B) is positioned to prevent the body diode of switch 432 from conducting when you turn on switch 420 and prevent a short circuit (except for the body-diode voltage drop) between the low and high reverse supplies. In addition, when switch 418 is opened, the diode allows the voltage at the junction of switches 418 and 420 to swing more negative than the voltage of the low voltage reverse bias supply 426 allowing a quick reversal of the current in the inductive element 406. Diode 438 allows the same to happen in the circuit of FIG. 4B. The implementation illustrated in FIG. 4A thus utilizes switches 432 and 420 and diode 434 as a three-position switch. The first position corresponds to disconnecting both reverse bias supplies 426 and 414 when both switch 434 and 420 are off (open). In this position, switch 418 would normally be on (closed) or otherwise configured to connect the forward bias current supply to the PIN diode 402. The second position corresponds to having the low voltage reverse bias supply 426 connected to the PIN diode when switch 432 is on and switch 420 is off. In this position switch 418 would normally be off and diode 434 would normally be forward biased. The third position corresponds to having the high voltage reverse bias supply connected to the PIN diode when switch 420 is on (conducting). In this position, switch 418 would normally be off and diode 434 reverse biased. Switch 418 acts as a switch to connect or disconnect the low voltage forward bias current supply 410 from the PIN diode. Through operation of switch devices 418, 420, 432, and diode 434 the circuit 400 may drive PIN diode 402 while consuming less power for high speed, high repetition rate, high power RF applications.

A second implementation circuit 401 is illustrated in FIG. 4B. Similar to circuit 400, circuit 401 includes include a PIN diode 404 connected to any type of RF circuitry, a representative inductance 408, a low voltage forward bias current supply 416 connected to switch 436 to provide a forward bias current to the PIN diode, and a high voltage reverse bias voltage supply 412 connected to switch 424 to provide a reverse bias voltage to the PIN diode. Also similarly, a low voltage reverse bias supply 428 may also be included in the circuit 401 to provide a low voltage reverse bias signal. In this configuration, the low voltage reverse bias supply 428 connects to switch 424 through diode 438. Also, switch device 430 connects to switch 424 and the diode 438. Through operation or activation of switch 424 and/or switch 430, either a low voltage reverse bias signal or a high voltage reverse bias signal is provided to the PIN diode 404 to drive the reverse bias operation of the diode. By providing the low voltage reverse bias signal prior to the high voltage reverse bias signal, the power consumed in operating the PIN diode 404 may be significantly reduced, particularly for high speed, high repetition rate, high power RF applications.

Figure 5A:
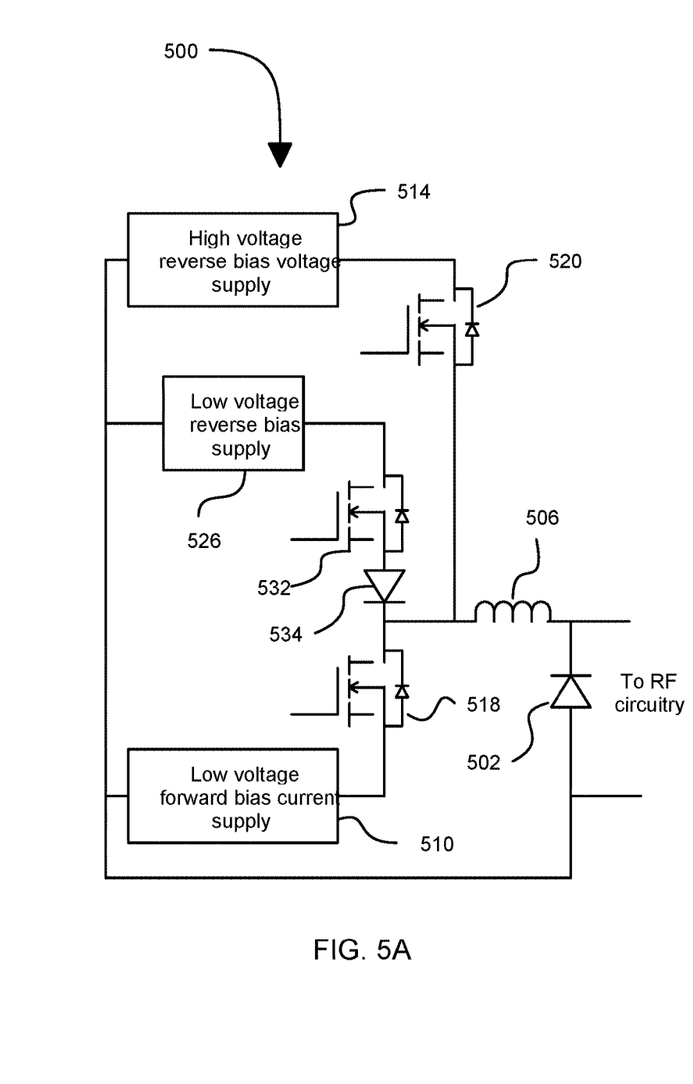
FIGS. 5A-5B illustrate two further example implementations of a triple supply PIN diode driver circuit.
Figure 5B:
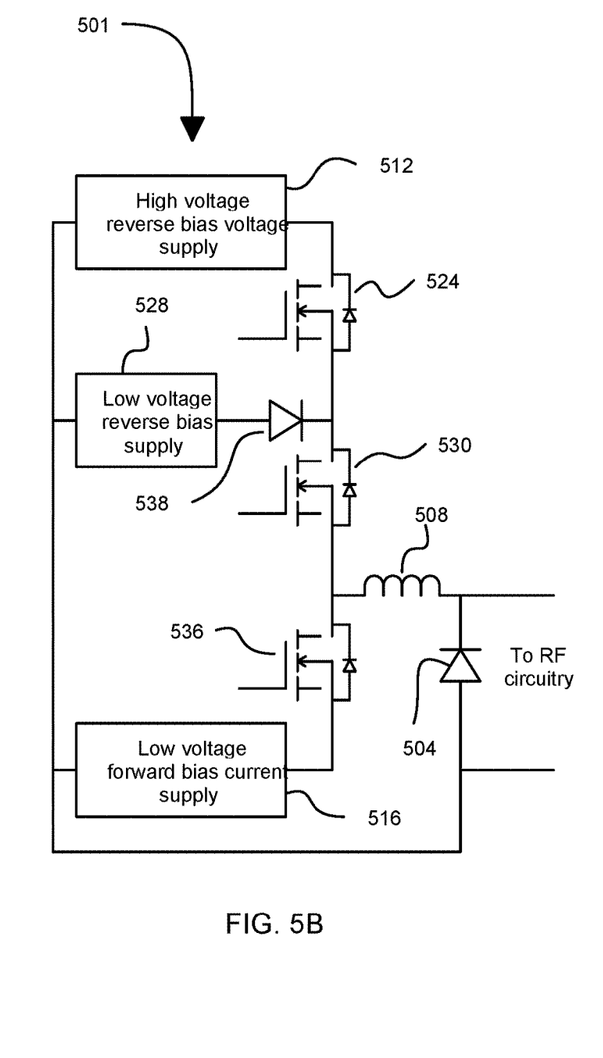

FIGS. 5A and 5B illustrate alternative embodiments of the present disclosure, which are equivalent to those of FIGS. 4A and 4B, respectively, for the case where the power supplies are referenced to the PIN diode anodes rather than the cathodes. In FIGS. 4A and 4B the low voltage reverse bias supplies 426 and 428 may for example provide −20 V with respect to the PIN diode cathodes to switch 432 and diode 438, respectively and the high voltage reverse bias supplies 414 and 412 may, for example, provide −1500 V with respect to the PIN diode cathodes to switches 420 and 424, respectively. In FIGS. 5A and 5B the low voltage revers bias supplies 526 and 528 may, for example, provide +20 V with respect to the diode anodes to switch 532 and diode 538, respectively and the high voltage reverse bias supplies 514 and 512 may for example provide +1500 V with respect to the diode anodes to switches 520 and 524, respectively. The forward bias current may be in the range of 0.1 A and 1 A. In many applications the low voltage reverse bias power supplies 426, 428, 526, 528 may have low source resistance, for example less than 1Ω and the high voltage reverse bias power supplies 414, 412, 514, 512 may have large source resistance, for example 1000Ω. A low source resistance for the low voltage reverse bias supply improves switching speed while a high source resistance for the high voltage reverse bias supply prevents overshoot of the PIN diode voltage during switching.

Such improved PIN driver circuits are especially useful in radio frequency matching networks that may have tens of such diodes if such matching networks are repetitively switched between multiple states, such as matching a non-linear load to a RF generator when the output power of the RF generator is modulated at a high rate and the matching network is expected to maintain a matched impedance to the generator. In other words, high speed, high repetition rate, high power applications that utilize a PIN diode may significantly reduce the power consumed by utilizing a driver circuit for the PIN diode that includes three or more power supplies operated as described herein. In such an application or otherwise, the three or more power supplies may be shared amongst multiple PIN diode driver arrangements.

Figure 6A:
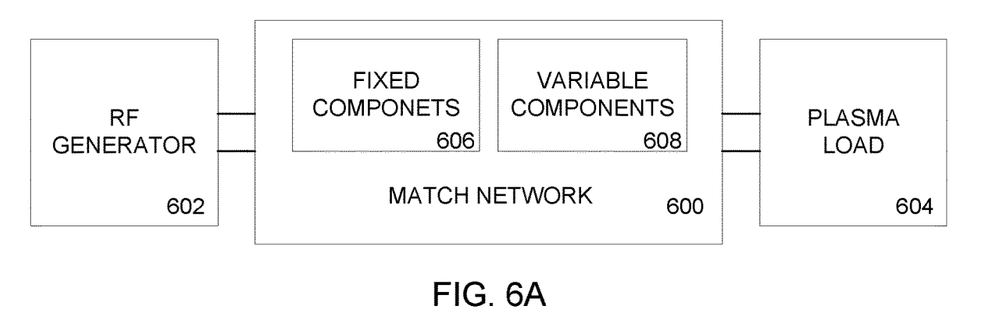
FIG. 6A is an example of a matching network used to match the impedance between a power supply, such as an RF generator, and a load, such as a plasma load in which a PIN diode driver circuit may be utilized.
Figure 6B:
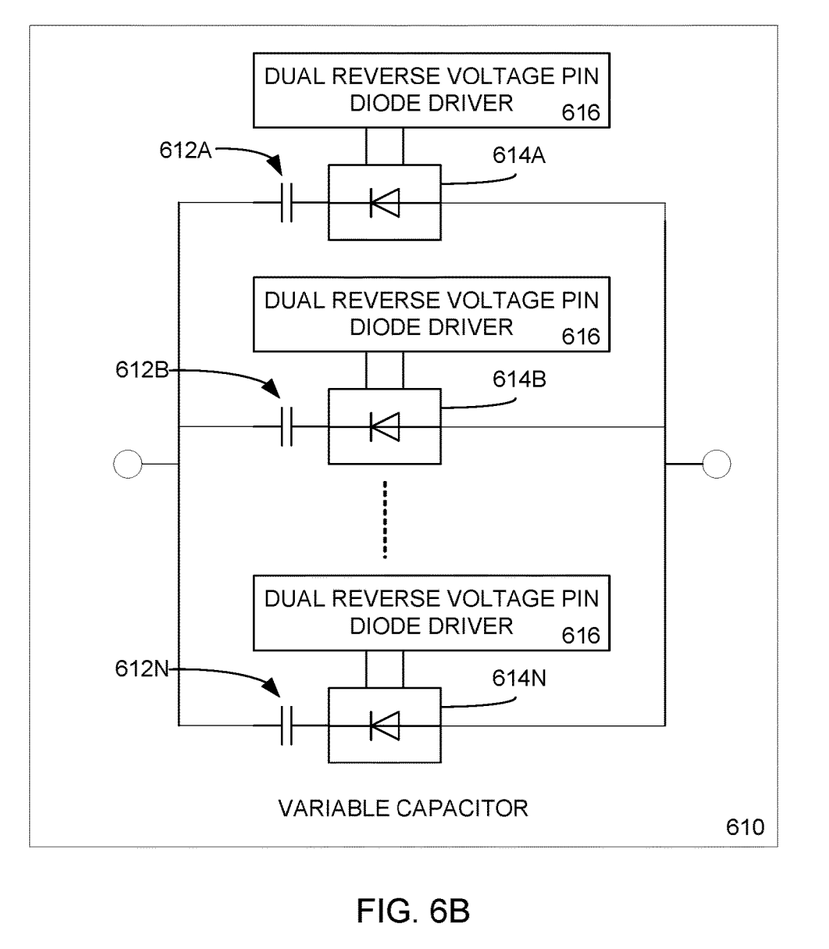
FIG. 6B is an example of a variable capacitor element of a match network.

FIGS. 6A and 6B illustrate examples of a matching network 600 used to match the impedance between a power supply 602, such as an RF generator, and a load 604, such as a plasma load and a specific example of a variable component 610 element of the match network shown in FIG. 6A. In this example, the match network, shown in a generalized representative form as the network may include several possible combinations of fixed 606 and variable 608 components, includes one or more variable components in addition to zero or more fixed components. One or more of the variable components can be implemented using reactive elements and switches to switch the reactive elements into and out of the circuit. For example a variable capacitor 610 can be implemented as a number of discrete switched capacitors 612A-612N in parallel. Each switched capacitor may include a capacitor connected in series with a PIN diode 614A-614N where the PIN diode is driven by one of the various possible example pin diode driver circuits 616 discussed herein. In this example, the driver circuit is referred to as a dual reverse-bias voltage PIN diode driver reflective of the notion that the driver circuit includes reverse biasing the respective PIN diode at two different levels, a first lower voltage level to discharge the intrinsic layer of the PIN diode followed by a second higher voltage level to reverse bias the PIN diode. The high voltage level must generally be higher than the largest amplitude of any RF signal over the PIN diode to avoid forward biasing the PIN diode during operation and is very typically one half of the breakdown voltage of the PIN diode, e.g. 1500 V reverse bias for a diode that can handle 3000 V. The circuits may also include the forward bias current supplies as illustrated herein. The forward bias current supply may be a true current supply (that regulates output current), but may also be as simple as a voltage source in series with a suitable resistor that provides a suitable level of forward current to the PIN diode. The forward current of the PIN diode determines the resistance of the PIN diode in the ON state. Typical values of the required forward current are between 0.01 and 1 A. Other match network topologies may also include PIN diodes. In the example illustrated, the capacitor value of any given switched capacitor may be the same or differ from the value of a different switched capacitor. It is possible to connect switched capacitors in various serial or parallel combinations, to obtain the desired value for a given variable capacitor of which the various switched capacitors form a part. Nonetheless, by forward biasing any given PIN diode, the respective capacitor may be switched into the match network, and when reverse biasing, the respective capacitor switched out of the network. Switching capacitors in and out of the match network controls the impedance transforming properties of the match network to match the impedance of the load to a desired impedance (typically 50Ω) into which the RF generator can efficiently deliver power.

Figure 7:
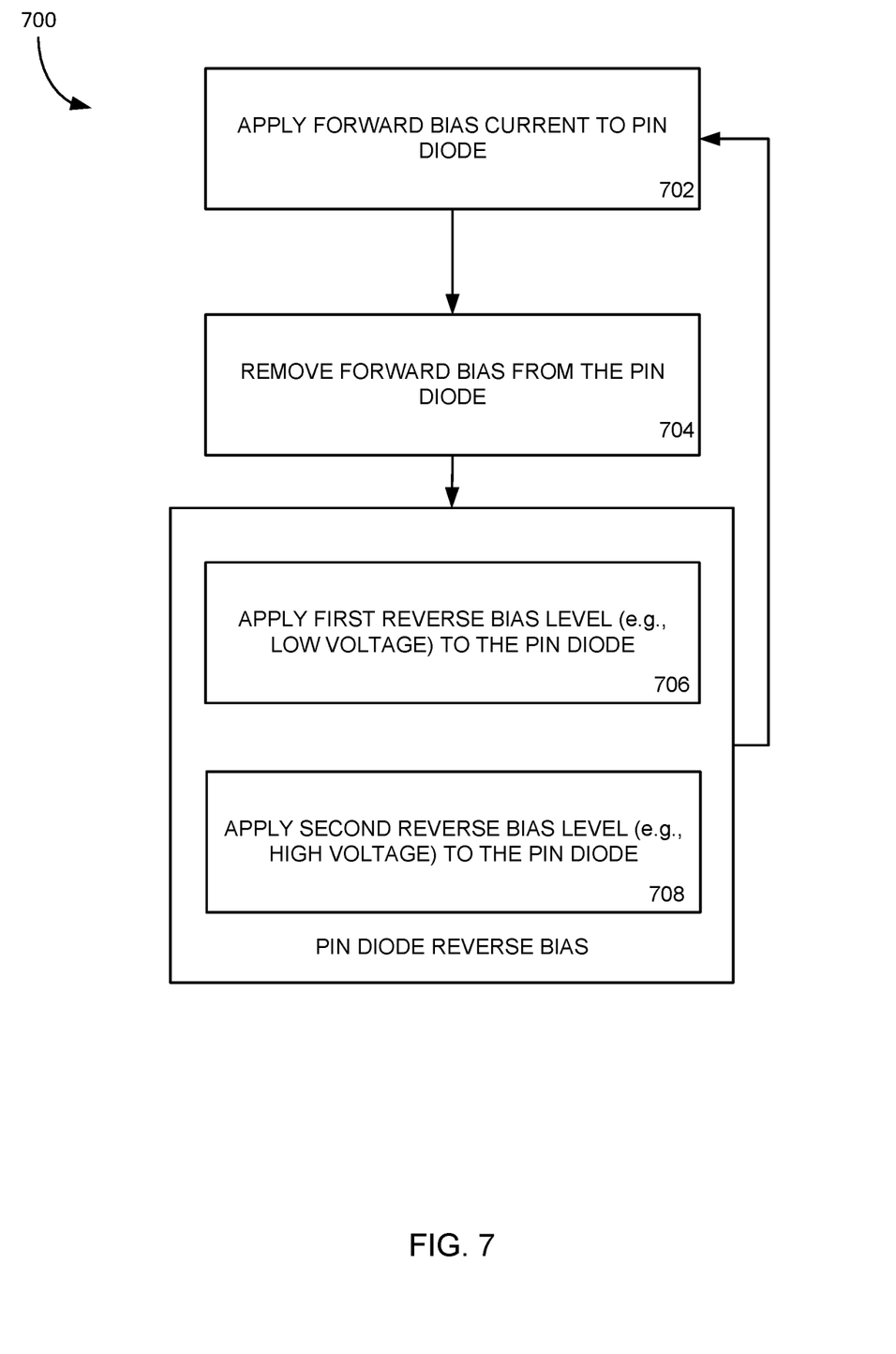
FIG. 7 is a method for controlling power supplies to control a PIN diode driver circuit for high speed, high repetition rate, high power applications.

FIG. 7 is a method 700 for controlling a PIN diode driver circuit to reduce the power consumption of PIN diodes, particularly in high speed, high repetition rate and high power RF applications, such as RF matching networks using many capacitors switched into various combinations by PIN diodes. The operations of the method 700 may be controlled or performed by a controller of the driver circuit, such as a programmable logic controller, computing device, a processing device, or the like.

Assuming for the sake of discussion that the diode begins in a forward bias orientation, a forward bias current may be first applied to the PIN diode (operation 702). Referring back to FIG. 3A, for example, a first switch 318 of a driver circuit 300 is in the closed position connecting the forward bias current supply to the PIN diode and a second switch 320 is in a first position disconnecting both reverse bias supplies. In particular, a control circuit or device may provide a switch activation signal to the switch 318 to close the switch and to switch 320 to put in in the first position. In the case of a MOSFET being a switch, the switch activation signal is in the form of an appropriate gate drive signal to cause the MOSFET to conduct (closed). Closing the switch 318 causes a low voltage current signal to be provided to the PIN diode 302 to forward bias the diode. In some embodiments, the controller may provide a control signal to the low power forward bias current supply 310 to activate the current supply to provide the current to the PIN diode.

The PIN diode is turned off by disconnecting the forward bias supply (operation 704) and connecting a first, relatively lower voltage to begin reverse biasing the PIN diode (operation 706). Thus, the controller may de-activate (or open) the first switch 318 to remove the forward bias current signal to the PIN diode. Further, in operation 706, the controller may control a second switch 320 into a second configuration to provide a low voltage reverse bias signal to the PIN diode 302 from a low voltage reverse bias supply 326. The low voltage provided to the PIN diode 302 may begin operating the PIN diode 302 in a reverse bias state. Following the initial low voltage reverse bias, a relatively higher voltage reverse bias is applied to the PIN diode (operation 708). More particularly, at some later time (but typically before a time equal to the carrier lifetime of the PIN diode has elapsed), the controller may provide a signal to change the second switch 320 into a third configuration that connects a high voltage reverse bias voltage supply 314 to the PIN diode 302 to further drive the PIN diode into the reverse bias state. As such, through the method 700 of FIG. 7, the controller may drive the PIN diode 302 between a forward bias state, and through two (or possibly more) reverse bias voltage levels as needed for the RF circuitry connected to the PIN diode. However, by utilizing a low voltage reverse bias supply 326 for some portion of driving the PIN diode in the reverse bias state, the driver circuit 300 may consume less power than other PIN diode driver circuits. For high power and fast switching circuits, such saving in consumed power may greatly improve the performance of the RF applications over traditional PIN diode drivers.

Figure 8:
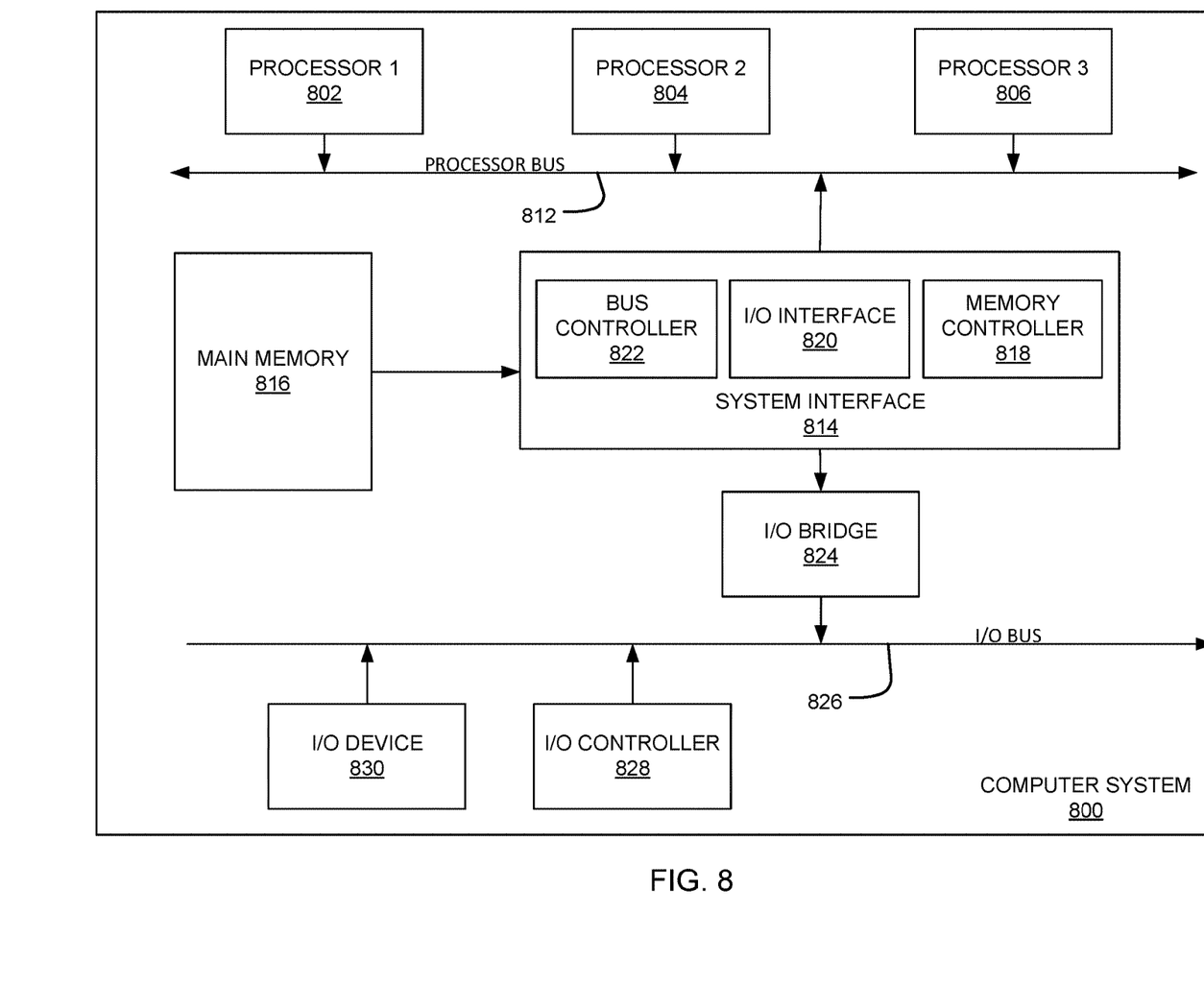
FIG. 8 is a diagram illustrating an example of a computing system which may be used in implementing embodiments of the present disclosure.

FIG. 8 is a block diagram illustrating an example of a computing device or computer system 800 which may be used in implementing the embodiments of the components of the network disclosed above. For example, the computing system 800 of FIG. 8 may be a control device for controlling any of the current or power supplies discussed above, in addition to providing any controlling signal to any of the switching devices for the driver circuits discussed above. The computer system (system) includes one or more processors 802-806. Processors 802-806 may include one or more internal levels of cache (not shown) and a bus controller or bus interface unit to direct interaction with the processor bus 812. Processor bus 812, also known as the host bus or the front side bus, may be used to couple the processors 802-806 with the system interface 814. System interface 814 may be connected to the processor bus 812 to interface other components of the system 800 with the processor bus 812. For example, system interface 814 may include a memory controller 818 for interfacing a main memory 816 with the processor bus 812. The main memory 816 typically includes one or more memory cards and a control circuit (not shown). System interface 814 may also include an input/output (I/O) interface 820 to interface one or more I/O bridges or I/O devices with the processor bus 812. One or more I/O controllers and/or I/O devices may be connected with the I/O bus 826, such as I/O controller 828 and I/O device 830, as illustrated. The system interface 814 may further include a bus controller 822 to interact with processor bus 812 and/or I/O bus 826.

I/O device 830 may also include an input device (not shown), such as an alphanumeric input device, including alphanumeric and other keys for communicating information and/or command selections to the processors 802-806. Another type of user input device includes cursor control, such as a mouse, a trackball, or cursor direction keys for communicating direction information and command selections to the processors 802-806 and for controlling cursor movement on the display device.

System 800 may include a dynamic storage device, referred to as main memory 816, or a random access memory (RAM) or other computer-readable devices coupled to the processor bus 812 for storing information and instructions to be executed by the processors 802-806. Main memory 816 also may be used for storing temporary variables or other intermediate information during execution of instructions by the processors 802-806. System 800 may include a read only memory (ROM) and/or other static storage device coupled to the processor bus 812 for storing static information and instructions for the processors 802-806. The system set forth in FIG. 8 is but one possible example of a computer system that may employ or be configured in accordance with aspects of the present disclosure.

According to one embodiment, the above techniques may be performed by computer system 800 in response to processor 804 executing one or more sequences of one or more instructions contained in main memory 816. These instructions may be read into main memory 816 from another machine-readable medium, such as a storage device. Execution of the sequences of instructions contained in main memory 816 may cause processors 802-806 to perform the process steps described herein. In alternative embodiments, circuitry may be used in place of or in combination with the software instructions. Thus, embodiments of the present disclosure may include both hardware and software components.

A machine readable medium includes any mechanism for storing or transmitting information in a form (e.g., software, processing application) readable by a machine (e.g., a computer). Such media may take the form of, but is not limited to, non-volatile media and volatile media. Non-volatile media includes optical or magnetic disks. Volatile media includes dynamic memory, such as main memory 816. Common forms of machine-readable medium may include, but is not limited to, magnetic storage medium; optical storage medium (e.g., CD-ROM); magneto-optical storage medium; read only memory (ROM); random access memory (RAM); erasable programmable memory (e.g., EPROM and EEPROM); flash memory; or other types of medium suitable for storing electronic instructions.

Embodiments of the present disclosure include various steps, which are described in this specification. The steps may be performed by hardware components or may be embodied in machine-executable instructions, which may be used to cause a general-purpose or special-purpose processor programmed with the instructions to perform the steps. Alternatively, the steps may be performed by a combination of hardware, software and/or firmware.

The description above includes example systems, methods, techniques, instruction sequences, and/or computer program products that embody techniques of the present disclosure. However, it is understood that the described disclosure may be practiced without these specific details. In the present disclosure, the methods disclosed may be implemented as sets of instructions or software readable by a device. Further, it is understood that the specific order or hierarchy of steps in the methods disclosed are instances of example approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

It is believed that the present disclosure and many of its attendant advantages should be understood by the foregoing description, and it should be apparent that various changes may be made in the form, construction and arrangement of the components without departing from the disclosed subject matter or without sacrificing all of its material advantages. The form described is merely explanatory, and it is the intention of the following claims to encompass and include such changes.

In the description and claims that follow, "greater" when applied to reverse bias voltage should be interpreted as greater in an absolute value sense. For example in this sense −1500 volt reverse bias is greater than −30 volt reverse bias because |−1500|>|−30|. Low and high when applied to reverse bias voltage should also be interpreted in an absolute value sense. For example in this sense a "low" reverse bias can be −15 volt while a "high" reverse bias voltage can be −1500 volt.

While the present disclosure has been described with reference to various embodiments, it should be understood that these embodiments are illustrative and that the scope of the disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

I claim:

1. A variable impedance matching network comprising:
   a plurality reactance elements arranged in parallel, wherein each of the reactance elements includes:
   a first terminal and a second terminal;
   a PIN diode arranged in series with a capacitor between the first terminal and the second terminal;
   a forward bias supply switchably coupled to the PIN diode to forward bias the PIN diode;

at least one reverse bias supply switchably coupled to the PIN diode and configured to apply a first reverse bias level followed by a second reverse bias level; and a transmission line, the transmission line positioned between the PIN diode and the forward bias supply and the transmission line is positioned between the PIN diode and the at least one reverse bias supply to pass power applied by forward bias supply and the at least one reverse bias supply to the PIN diode while suppressing an RF signal applied across the first and second terminal; and a controller configured to, in each of the reactance elements:

control the forward bias supply to control a resistance of the PIN diode; and control the at least one reverse bias supply to apply the first reverse bias level to discharge an intrinsic layer of the PIN diode followed by the second reverse bias level to reverse bias the PIN diode.

2. The variable impedance matching network of claim 1, wherein a length of the transmission line is a quarter wavelength of the signal applied across the first and second terminal.

3. The variable impedance matching network of claim 1, wherein the first reverse bias level is a first reverse bias voltage and the second reverse bias level is a second reverse bias voltage greater than the first reverse bias voltage.

4. The variable impedance matching network of claim 1, wherein the forward bias supply is a forward bias current supply.

5. The variable impedance matching network of claim 1, wherein the at least one reverse bias supply is a multi-level power supply.

6. The variable impedance matching network of claim 2 wherein the at least one reverse bias supply comprises a first voltage supply to provide the first reverse bias voltage and a second voltage supply to provide the second reverse bias voltage.

7. A power system, comprising:
a power supply; and
a match network coupled to the power supply, the match network comprising:
a plurality of switched capacitor components, each of the switched capacitor components comprising a capacitor connected in series with a PIN diode;
means for:
connecting a first reverse bias voltage to the PIN diodes; and
after connecting the first reverse bias voltage to the PIN diodes and before forward biasing the PIN diodes, connecting a second reverse bias voltage, greater than the first reverse bias voltage, to the PIN diodes; and
means for blocking the means for discharging from RF power applied by the power supply.

8. The power system of claim 7, wherein the means for blocking comprises a transmission line positioned between each PIN diode and the means for discharging to pass power applied by the means for discharging to the PIN diode while suppressing the power applied by the power supply.

9. The power system of claim 8, wherein a length of the transmission line is a quarter of a wavelength of the power applied by the power supply.

10. The power system of claim 7, wherein the first reverse bias voltage is about 15 volts and the second reverse bias voltage is about 1500 volts.

11. The power system of claim 7, wherein the first reverse bias voltage is about −15 volts and the second reverse bias voltage is about −1500 volts.

12. The power system of claim 7 further comprising means for adjusting at least one of the first reverse bias voltage and the second reverse bias voltage based on a switching frequency of the PIN diode.

13. The power system of claim 7, wherein the second reverse bias voltage is with a range of 3 to 2000 times the value of the first reverse bias voltage.

* * * * *